United States Patent [19]

Suzki

[11] 4,167,677

[45] Sep. 11, 1979

[54] OPTICAL DEVICE FOR THE ALIGNMENT OF TWO SUPERIMPOSED OBJECTS

[75] Inventor: Akiyoshi Suzki, Tokyo, Japan

[73] Assignee: Canon Kabushiki Kaisha, Tokyo, Japan

[21] Appl. No.: 870,089

[22] Filed: Jan. 17, 1978

[30] Foreign Application Priority Data

Jan. 21, 1977 [JP] Japan ................................ 52-5502

[51] Int. Cl.² .................................................. G01N 21/30
[52] U.S. Cl. .................................. 356/401; 356/399; 250/548
[58] Field of Search .............. 356/172, 192, 141, 169; 250/548, 237 R, 237 G, 557, 201

[56] References Cited

U.S. PATENT DOCUMENTS

| 3,796,497 | 3/1974 | Mathisen et al. | 356/152 |
| 3,865,483 | 2/1975 | Wojcik | 250/548 |
| 3,867,038 | 2/1975 | Westell | 356/172 |

Primary Examiner—David C. Nelms
Attorney, Agent, or Firm—Fitzpatrick, Cella, Harper & Scinto

[57] ABSTRACT

This invention provides an optical device for detecting the position of a second mark relative to a first mark by optically scanning the first and second marks on a scanning surface. The first and second marks are scanned by a scanning spot light and the reflecting lights from the first and second marks are detected by a photoelectric detector. The relative positions of the first and second marks are computed on the basis of the detected signals.

6 Claims, 11 Drawing Figures

OPTICAL DEVICE FOR THE ALIGNMENT OF TWO SUPERIMPOSED OBJECTS

BACKGROUND OF THE INVENTION

1. Field of the Invention

This invention relates to an optical device for detecting the position of a first mark relative to a second mark by optically scanning the first and second marks on a scanning surface.

2. Description of the Prior Art

One form of such apparatus is described in U.S. Pat. No. 3,683,195, issued Aug. 8, 1972 the Karl-Heinz Johannsmeier et al, entitled "Apparatus for the automatic alignment of two superimposed objects, e.g. a semiconductor wafer and mask". According to this apparatus, mask and wafer having alignment marks on a scanning surface for semiconductor printing are superimposed and these alignment marks are scanned to detect the relative positions of alignment marks so as to detect the relative positions of the mask and wafer. The alignment mark of the mask is constituted by first and second bars parallel to each other and third and fourth bars parallel to each other and crossed with said first and second bars at a right (90) angle. The alignment mark of the wafer consists of fifth and sixth bars crossing with each other at a right (90) angle.

The scanning of these alignment marks is performed by a movable aperture disposed at the position of the enlarged image, and this movable aperture silt-shaped for increasing the level of the detecting signal.

By making the movable aperture as slits, the two slit-shape apertures crossing at a right (90) angle must be provided for detecting the crossing bars. One slit detects the position of the mark of one orientation and the other slit detects the position of the mark of the other orientation which is positioned at a right angle to said mark of one orientation.

Thus according to the prior art, taking the light amount into consideration, it is necessary to provide a plurality of the slits which complicates the structure of the optical system.

SUMMARY OF THE INVENTION

This invention is to overcome the disadvantage of the prior art and to provide an optical system which is simple in structure.

For this purpose, according to this invention, spot scanning is utilized, and the scanning lines formed by this spot-scanning cross all of the bars constituting the marks. It is to be noted here that a spot-light is a spot having no orientation characters to the marks, for example, a spot having an intensity distribution of gauss type which is of a centre-symmetry. The spot scanning is made by directly scanning a surface with the aid of a spot light or by illuminating over a wide range of a scanning surface and providing a spot opening, e.g. circular aperture, which moves to the image position of the scanning surface.

DESCRIPTION OF THE PREFERRED EMBODIMENTS

Figure 1:
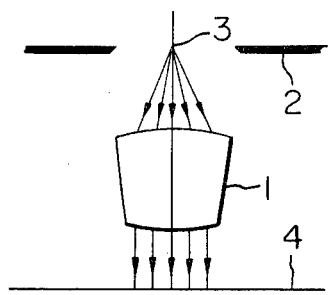
FIG. 1 shows a light path in the vicinity of an objective lens in realizing the present invention.

FIG. 1 shows a portion of the device of this invention in which 1 is an objective lens. A scanning laser beam coming from a scanning device such as for example a not-shown rotating polyhedron mirror passes the center 3 of the stop 2 provided at the position of the pupil of the objective lens 1.

The center 3 of the stop 2 is the original point of the oscillation of the scanning beam. It is therefore necessary to locate the reflecting point of the rotating polyhedron mirror at the center 3 of the stop 2, or to make the position of the center 3 of the stop 2 conjugate with the reflecting point of the polyhedron mirror by a lens disposed between the polyhedron mirror and the stop surface. The stop surface 2 coincides with the focal plane of the objective lens and this structure is called a telecentric optical system. By this arrangement, main light rays from each of the scanning beams coming from the objective lens become parallel with the optical axis of the objective lens. Each of the scanning beams coming from the objective lens scans the scanning surface 4, which is not necessarily one surface, and in case of the manufacture of an integrated circuit (I.C.), the mask and wafer are simultaneously scanned for matching the positions of the mask and wafer. The light rays reflected by the scanning surface progress again toward the stop through the objective lens 1. The reflecting light rays are introduced into a photoelectric conversion system comprising conventional half-mirror, lens and photodetector.

One example of such optical system is disclosed in the copending U.S. Ser. No. 790,072 filed Apr. 22, 1977 of Suzuki et al.

Taking an example of alignment marks formed on two work pieces, e.g. mask and wafer, explanation will be made of how to optically read the marks. In case of I.C. printing, the mask and wafer must be placed in a predetermined relationship, and during this operation, the mask and wafer are maintained in parallel with a space therebetween of several tens $\mu m$ in case of the contact method or the proximity method, whereas the mask and wafer are maintained conjugate with each other in case of the projection method.

Figure 2:
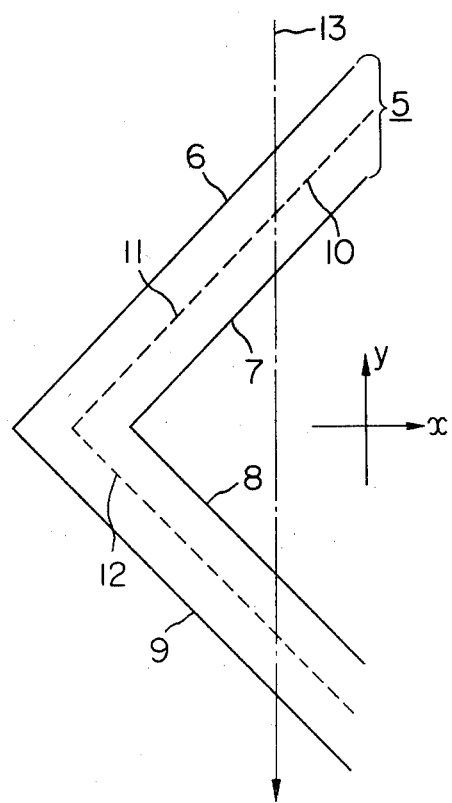
FIG. 2 shows a preferable arrangement of the alignment mark and scanning lines.

FIG. 2 shows a drawing where the mask and wafer are observed while they are maintained in the state mentioned above. In other words, the pattern of the wafer is viewed by the objective lens 1 through the mask. In this figure, alignment mark 5 is formed on the mask and comprises the first bar 6 and second bar 7, which are in parallel relationship and the third bar 8 and fourth bar 9, which are in parallel relationship, the first and second bars or their extensions being crossed at a right angle with the third and fourth bars. The alignment mark 10 is formed on the wafer and comprises the fifth and sixth bars 11 and 12, respectively, these bars or their extensions being crossed with each other at a right angle. The scanning lines 13 are formed by the movement of the scanning spot laser beam focussed on the scanning surface 4 in a circular form by the objective lens 1. The scanning lines 13 cross at an angle of 45 degree with bars 6, 7, 8 and 9 and 11 and 12. And the relative positions in x and y directions of the marks 5 and 10 are detected by scanning the marks 5 and 10 with the aid of the spot laser beam.

Figure 3:
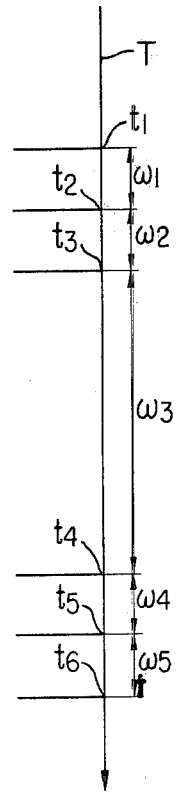
FIG. 3 shows in a model type the outputs of this embodiment.

FIG. 3 shows detected signals when the marks 5 and 10 are scanned while they are maintained at the relative positions shown in FIG. 2, assuming that in these positions marks 5 and 10 are in their adjusted positions. In FIG. 3, the ordinate shows times and $t_1$, $t_3$, $t_4$, $t_6$, $t_2$ and $t_5$ correspond to the scanning times of the first through sixth bars 6, 7, 8, 9, 11 and 12, respectively. At the times of $t_1, \ldots, t_6$, the respective bar detecting signals are obtained, whereas $\omega_1, \ldots, \omega_5$ are time intervals between detected signals. Consequently, when the mark 5 deviates relative to the mark 10 in x and y directions, the time intervals $\omega_1$ and $\omega_2$ and the time intervals $\omega_4$ and $\omega_5$ become different. It follows therefore that when there is a difference between the intervals $\omega_1$ and $\omega_2$ and $\omega_4$ and $\omega_5$, the marks 5 and 10 are not adjusted in their correct positions.

Now the explanation will be made for the method of detecting the amounts of deviations in x and y directions.

For simplifying the explanation, it is assumed that the scanning line 13 coincides with the y axis direction, the marks 5 and 10 cross the scanning line 13 at an angle of 45 degrees, and the apex $B_1$ of the mark 10 occurs at the middle of the apexes $A_1$ and $A_2$ of the mark 5 when the positions of the marks 5 and 10 are completely adjusted.

Figure 4:
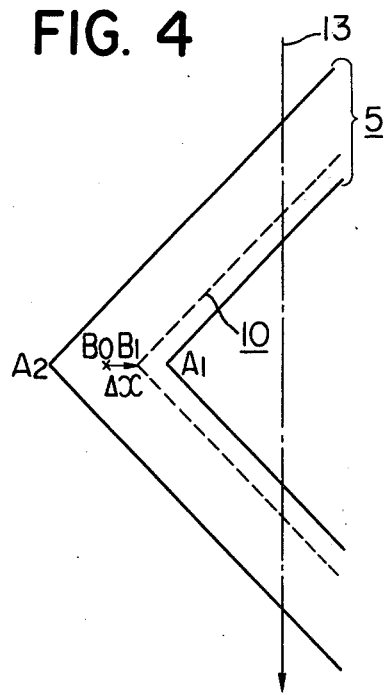
FIG. 4 shows a relative position of the mark when the alignment mark deviates to x direction.
Figure 5:
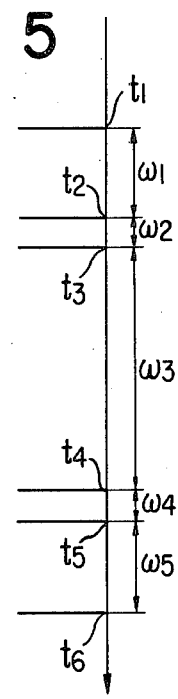
FIG. 5 shows its output in model type.
Figure 6:
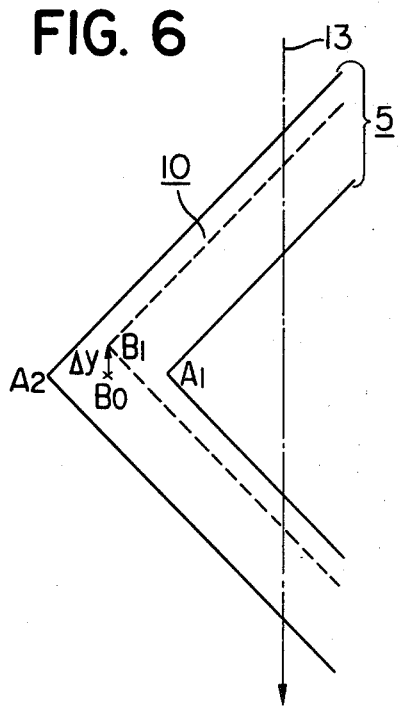
FIG. 6 shows a relative position of the mark when the alignment mark deviates to y direction.
Figure 7:
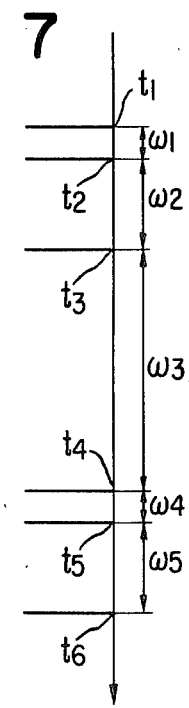
FIG. 7 shows its output.

FIGS. 4 through 7 show how to find the deviations of the marks 5 and 10 in such a system as mentioned before. In these figures, the middle point $B_0$ between $A_1$ and $A_2$ is assumed as a position to be occupied by the apex of the mark 10. In FIG. 4 the mark 10 deviates from $B_0$ by $\Delta x$; in FIG. 6 the mark 10 deviates from $B_0$ by $\Delta y$. In FIG. 4, where mark 10 deviates by $\Delta x$, the outputs of $\omega_1$ and $\omega_5$ increase the same amount, while the outputs $\omega_2$ and $\omega_4$ decrease the same amount, which is equal to said increased amount as shown in FIG. 5. In case of FIG. 6, the outputs or time intervals $\omega_1$ and $\omega_4$ decrease the same amount and the outputs $\omega_2$ and $\omega_5$ increase the same amount, both amounts being the same. As explained, the combinations of the time intervals to be increased or decreased are different depending on the directions of the deviations in $\Delta x$ or $\Delta y$, which are shown in the following simple equations.

$$\Delta x = k \frac{(\omega_1 - \omega_2) - (\omega_4 - \omega_5)}{4}$$

$$\Delta y = k \frac{-(\omega_1 - \omega_2) - (\omega_4 - \omega_5)}{4}$$

where k is a proportional constant between the pulse interval $\omega$ and the amount of deviation and it is proportional to the scanning speed of the laser spot. It is easily understood that when the positional adjustments of the marks 5 and 10 are completed, the apex $B_1$ of the mark 10 becomes coincident with $B_0$, and $\omega_1 = \omega_2$, $\omega_4 = \omega_5$ and $\Delta x = \Delta y = 0$.

It should be noted here that when there is a working error in manufacturing a mask or a stretching of a wafer so that there is a deviation or shift between an alignment mark and a real element, the real element will be deviated even though the alignment marks coincide so as to obtain $\Delta x = \Delta y = 0$. This is generally referred to as the off-set amount. In this case, by preliminarily giving the deviation between the alignment mark and the real element, the relationship among the time or pulse intervals $\omega_1$ through $\omega_5$ can be easily obtained by the calculation equations of $\Delta x$ and $\Delta y$ mentioned previously.

In the embodiment of this invention, a laser is used as a light source and the scanning light is composed of a laser spot. It is quite difficult by a conventional light source to illuminate the surface of a subject with a large quantity of light and to stop to a small spot diameter for obtaining a high precision of a detection. However, laser beam has a high brightness and a good directivity, so that it completely satisfies said conditions. The technique for making a spot scanning on a substrate becomes a very effective means by utilizing a laser beam as shown in this embodiment.

Figure 8:
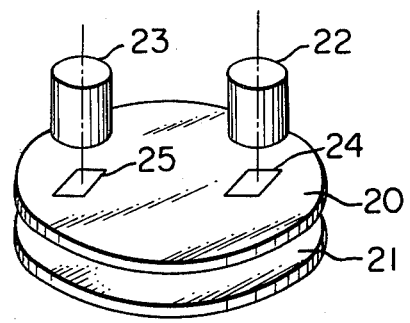
FIG. 8 shows an optical system to observe a body at a plurality of positions and to detect parallel shift component and rotating component.
Figure 9:
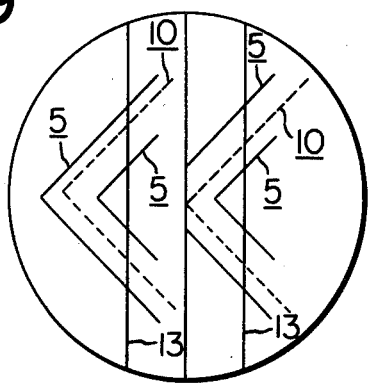
FIGS. 9 and 10 show a case where alignment mark is detected by the optical system of FIG. 8
Figure 10:
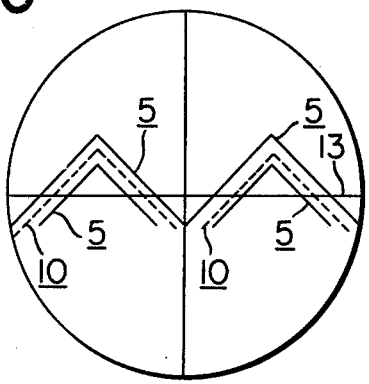

In the above embodiments, the parallel deviation components in x and y directions of the mask and wafer are detected by detecting the deviation in x and y directions of the marks 5 and 10, however, in reality, for adjusting the positions of two-dimension body, such as mask and wafer, the rotating component $\theta$ must be detected. For detecting the rotating component, the detections at a plurality of the positions of, for example, mask and wafer should be made. FIG. 8 shows this detection, in which two different positions 24 and 25 on the mask 20 are observed by the objective lenses 22 and 23. At the positions 24 and 25, the alignment marks in accordance with this invention are arranged and at the corresponding positions of the wafer 21 there are also alignment marks, although the latter marks are not shown. FIGS. 9 and 10 show the patterns of the mask and wafer, respectively, by compounding the half field of the objective lens 22 and that of the objective lens 23. Such method of observation is called a split field. In FIG. 9, the scanning lines 13 are arranged in parallel with the field split line and the marks 5 and 10 of FIG. 2 are crossing, respectively, the lines 13. In FIG. 10, the scanning line 13 is perpendicular to the field split line and the orientations of the marks 5 and 10 are different by 90° from the case of FIG. 9.

One side and the other side of the split fields are called right field and left field, respectively. There may be various methods for scanning right and left fields. In FIG. 9, the simplest method is to make a plurality of beams and dividing these beams for scanning right and left fields, respectively. A plurality of beams can easily be obtained by using a plurality of light sources or a single light sources split by a beam splitting element, for example, a beam splitter or crystal, and the plurality of beams are directed to each field. An alternative method is to scan each field separately in changing the time. In this case, a single light source is sufficient and it is not necessary to divide the beams.

In the case of FIG. 10, said alternative method is most preferable. In other words, the left and right fields are scanned alternately. This is easily realized by scanning the optical system after the right and left fields are overlapped.

Figure 11:
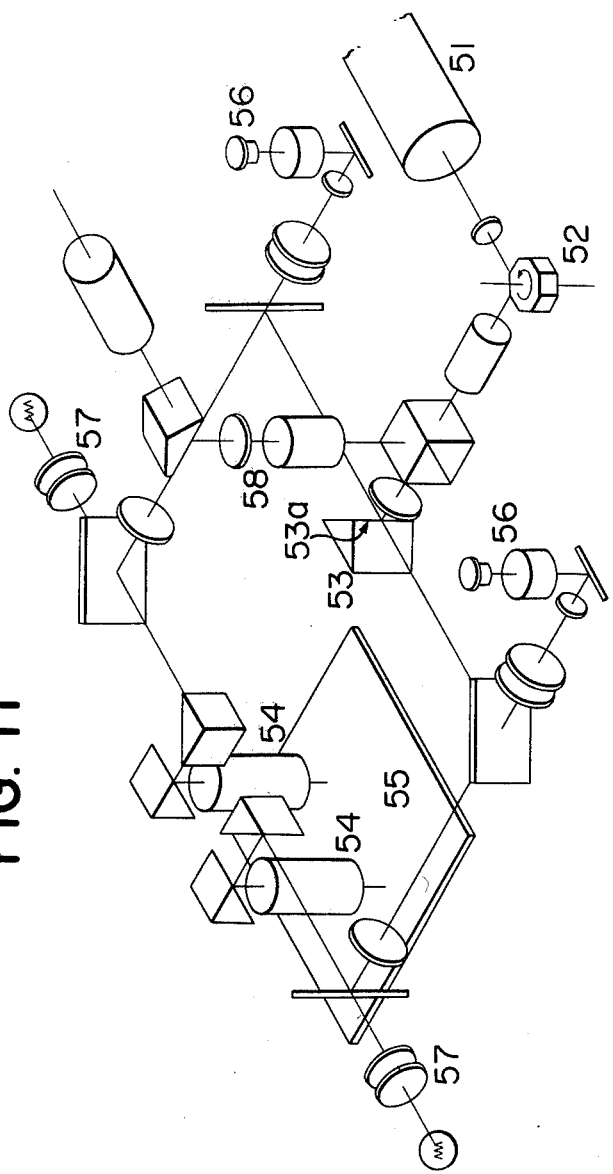
FIG. 11 shows an optical arrangement of the alignment device.

For example, FIG. 11 shows an example where the photo-detecting device of said U.S. Ser. No. 790,072 is applied to the present invention. In this figure, under the mask 55 there is a not shown wafer. Two points on the mask are observed by the objective lenses 54, and for the purpose of observing both points simultaneously, each half of the images from the two objective lenses 54 are compounded by the field composite prism 53. In FIGS. 9 and 10, the split line dividing the right and left fields at the center is the ridge line 53a of the prism 53, and 58 is an observing system for eyeshot and 57 is an illuminating system for eyeshot. This optical system is scanned by the beam from the laser 51, and in case of FIG. 11, this is achieved by rotating the polygon 52. In FIG. 11, in view of the rotating direction, the movement of the laser beam is perpendicular to the ridge line 53a the image shown in FIG. 10 is obtained through eyeshot observation.

Thus in the example of FIG. 8, the mask and wafer are measured at the respective two portions, so as to obtain the deviations of the mask in x and y directions relative to the wafer. These amounts of deviations are noted as $\Delta x_{right}$, $\Delta x_{left}$, $\Delta y_{right}$ and $\Delta y_{left}$, and the distance between two marks is 2R, then the deviations $\Delta x$, $\Delta y$ and $\Delta\theta$ of the mask to the wafer are $$\Delta x = \frac{\Delta x_{right} + \Delta x_{left}}{2},$$

$$\Delta y = \frac{\Delta y_{right} + \Delta y_{left}}{2}, \text{ and}$$

$$\Delta\theta = \tan^{-1}\frac{\Delta y_{right} - \Delta y_{left}}{R}$$

In FIG. 8, a not-shown driving system is used to correct the deviations by compensating said values so as to complete alignment.

As explained in the foregoing, according to this invention, it is possible to avoid, by using spot scanning, the complexity of scanning two directions with a plurality of slits of the conventional method. The effective spot scanning with a high precision can be attained by a laser spot, which enables a sufficiently high quantity of light for detecting the position of a body to be observed.

What is claimed is:

1. An optical device comprising:
   a light source for producing a stationary beam;
   a scan optical system for converting said stationary beam to a moving spot on a scanning surface;
   a substance placed on the scanning surface, the substance having first and second marks to be scanned by said moving spot, the first mark comprising four bars, the first and second bars and the third and fourth bars being parallel, respectively, with a predetermined distance, therebetween the first and second bars including their extensions and the third and fourth bars including their extensions crossing at a predetermined angle, and said second mark comprising fifth and sixth bars, the fifth and sixth bars including respective extensions crossing at a predetermined angle, and the first through sixth bars crossing at a desired angle, respectively, a scanning line formed by the movement of the scanning spot;
   a photoelectric detector receiving the lights from said first and second marks; and
   a computing device to measure the relative positions of the first and second marks on the basis of the signals detected by the photoelectric detector.

2. An optical device according to claim 1, in which said scanning spot is a laser spot beam.

3. An optical device according to claim 1, in which said first mark is formed on a first workpiece and the second mark is formed on a second workpiece.

4. An optical device according to claim 3, in which said first and second workpieces are scanned along a plurality of scan lines different in positions, respectively, and on these first and second workpieces a plurality of the first and second marks, respectively, are formed along said scan lines.

5. An optical device according to claim 1, in which each of said predetermined angles is 90 degree.

6. An optical device according to claim 1, in which said desired angle is 45 degree.

* * * * *